(12) United States Patent
Huang et al.

(10) Patent No.: US 10,396,255 B2
(45) Date of Patent: Aug. 27, 2019

(54) LIGHT EMITTING COMPONENT

(71) Applicant: Genesis Photonics Inc., Tainan (TW)

(72) Inventors: Kuan-Chieh Huang, Tainan (TW);
Shao-Ying Ting, Tainan (TW); Jing-En Huang, Tainan (TW); Yi-Ru Huang, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 15/823,480

(22) Filed: Nov. 27, 2017

(65) Prior Publication Data

US 2018/0083168 A1 Mar. 22, 2018

Related U.S. Application Data

(63) Continuation of application No. 15/168,218, filed on May 30, 2016, now Pat. No. 9,831,399, which is a (Continued)

(30) Foreign Application Priority Data

Jun. 12, 2014 (TW) .............................. 103120334 A

(51) Int. Cl.
*H01L 33/50* (2010.01)
*H01L 33/54* (2010.01)
(Continued)

(52) U.S. Cl.
CPC .......... *H01L 33/505* (2013.01); *H01L 33/507* (2013.01); *H01L 33/54* (2013.01); *H01L 33/56* (2013.01); *H01L 33/60* (2013.01)

(58) Field of Classification Search
CPC ....... H01L 33/505; H01L 33/60; H01L 33/56; H01L 33/507; H01L 33/54
See application file for complete search history.

(56) References Cited

U.S. PATENT DOCUMENTS 6,155,699 A 12/2000 Miller et al.
7,045,828 B2 5/2006 Shimizu et al.
(Continued)

FOREIGN PATENT DOCUMENTS

CN 101855735 10/2010
CN 101867003 10/2010
(Continued)

OTHER PUBLICATIONS

Fukazawa et al. (JP 20120227470) machine translation document (Year: 2012).*
(Continued)

*Primary Examiner* — Yasser A Abdelaziez
(74) *Attorney, Agent, or Firm* — JCIPRNET

(57) ABSTRACT

A light emitting component includes a light emitting unit, a molding compound and a wavelength converting layer. The light emitting unit has a forward light emitting surface. The molding compound covers the light emitting unit. The wavelength converting layer is disposed above the molding compound. The wavelength converting layer has a first surface and a second surface opposite to the first surface, wherein the first surface is located between the forward light emitting surface and the second surface, and at least one of the first and second surfaces is non-planar.

15 Claims, 7 Drawing Sheets

Related U.S. Application Data continuation of application No. 14/462,581, filed on Aug. 19, 2014, now Pat. No. 9,356,205.

(51) Int. Cl.
  *H01L 33/56* (2010.01)
  *H01L 33/60* (2010.01)

(56) References Cited

U.S. PATENT DOCUMENTS

| | | | |
|---|---|---|---|
| 8,350,283 B2 | 1/2013 | Nishiuchi et al. | |
| 8,482,016 B2 * | 7/2013 | Harada | H01L 33/56 257/88 |
| 8,860,061 B2 | 10/2014 | Kotani | |
| 9,419,189 B1 | 8/2016 | David et al. | |
| 9,490,398 B2 | 11/2016 | Oyamada et al. | |
| 9,887,329 B2 | 2/2018 | Yamada | |
| 9,922,963 B2 | 3/2018 | Hung et al. | |
| 2003/0006509 A1 | 1/2003 | Suzuki et al. | |
| 2003/0067070 A1 | 4/2003 | Kwon et al. | |
| 2005/0045897 A1 | 3/2005 | Chou et al. | |
| 2006/0055309 A1 | 3/2006 | Ono et al. | |
| 2006/0169994 A1 | 8/2006 | Tu et al. | |
| 2007/0114552 A1 | 5/2007 | Jang et al. | |
| 2008/0150119 A1 | 6/2008 | Jang et al. | |
| 2009/0242917 A1 | 10/2009 | Inoue et al. | |
| 2009/0296389 A1 | 12/2009 | Hsu | |
| 2010/0066236 A1 | 3/2010 | Xu et al. | |
| 2010/0258419 A1 | 10/2010 | Chung et al. | |
| 2010/0258830 A1 | 10/2010 | Ide et al. | |
| 2011/0001157 A1 | 1/2011 | McKenzie et al. | |
| 2011/0079805 A1 | 4/2011 | Yu et al. | |
| 2011/0102883 A1 | 5/2011 | Narendran et al. | |
| 2012/0025218 A1 | 2/2012 | Ito et al. | |
| 2012/0235126 A1 | 9/2012 | Yamazaki et al. | |
| 2012/0236582 A1 | 9/2012 | Waragaya et al. | |
| 2012/0305942 A1 | 12/2012 | Lo et al. | |
| 2013/0001605 A1 | 1/2013 | Ishihara et al. | |
| 2013/0093313 A1 | 4/2013 | Oyamada | |
| 2013/0105978 A1 | 5/2013 | Hung | |
| 2013/0121000 A1 | 5/2013 | Lee et al. | |
| 2013/0194794 A1 * | 8/2013 | Kim | F21V 9/00 362/231 |
| 2013/0207141 A1 | 8/2013 | Reiherzer | |
| 2013/0207142 A1 | 8/2013 | Reiherzer | |
| 2013/0256711 A1 | 10/2013 | Joo et al. | |
| 2013/0277093 A1 | 10/2013 | Sun et al. | |
| 2013/0313594 A1 | 11/2013 | Han et al. | |
| 2014/0021493 A1 | 1/2014 | Andrews et al. | |
| 2014/0054621 A1 | 2/2014 | Seko | |
| 2014/0124812 A1 | 5/2014 | Kuramoto et al. | |
| 2014/0131753 A1 | 5/2014 | Ishida et al. | |
| 2014/0138725 A1 | 5/2014 | Oyamada | |
| 2014/0252389 A1 | 9/2014 | Koizumi et al. | |
| 2015/0014720 A1 | 1/2015 | Tien | |
| 2015/0102373 A1 | 4/2015 | Lee et al. | |
| 2015/0102377 A1 | 4/2015 | Huang et al. | |
| 2015/0115300 A1 | 4/2015 | Tomizawa et al. | |
| 2015/0179901 A1 | 6/2015 | Ok et al. | |
| 2015/0188004 A1 | 7/2015 | Ozeki et al. | |
| 2015/0263242 A1 | 9/2015 | Tomizawa et al. | |
| 2015/0311405 A1 | 10/2015 | Oyamada et al. | |
| 2016/0013373 A1 | 1/2016 | Bhat et al. | |
| 2016/0035952 A1 | 2/2016 | Yamada et al. | |
| 2016/0079496 A1 | 3/2016 | Huang et al. | |
| 2016/0155900 A1 | 6/2016 | Bono et al. | |
| 2016/0155915 A1 | 6/2016 | Ling et al. | |
| 2016/0181476 A1 | 6/2016 | Chang et al. | |
| 2016/0190406 A1 | 6/2016 | Liu et al. | |

FOREIGN PATENT DOCUMENTS

| | | |
|---|---|---|
| CN | 101878540 | 11/2010 |
| CN | 101978516 | 2/2011 |
| CN | 102132428 | 7/2011 |
| CN | 102222757 | 10/2011 |
| CN | 102263194 | 11/2011 |
| CN | 102290500 | 12/2011 |
| CN | 102347423 | 2/2012 |
| CN | 102468417 | 5/2012 |
| CN | 102637809 | 8/2012 |
| CN | 102738368 | 10/2012 |
| CN | 103022010 | 4/2013 |
| CN | 103050601 | 4/2013 |
| CN | 103137571 | 6/2013 |
| CN | 103187515 | 7/2013 |
| CN | 103531725 | 1/2014 |
| CN | 103554822 | 1/2014 |
| CN | 203774363 | 8/2014 |
| CN | 104347610 | 2/2015 |
| JP | 2012227470 | * 11/2012 |
| TW | 201017934 | 5/2010 |
| TW | 201114072 | 4/2011 |
| TW | 201133956 | 10/2011 |
| TW | 201210819 | 3/2012 |
| TW | 201220534 | 5/2012 |
| TW | 201242108 | 10/2012 |
| TW | 201249898 | 12/2012 |
| TW | 201515282 | 4/2015 |
| TW | 201541674 | 11/2015 |
| WO | 2011093454 | 8/2011 |

OTHER PUBLICATIONS

"Office Action of U.S. Appl. No. 16/004,445", dated Sep. 27, 2018, pp. 1-16.

"Office Action of U.S. Appl. No. 15/881,802", dated Aug. 10, 2018, pp. 1-23.

"Office Action of U.S. Appl. No. 15/787,811", dated Oct. 2, 2018, pp. 1-49.

"Office Action of U.S. Appl. No. 15/657,299", dated Oct. 18, 2018, pp. 1-20.

"Office Action of Taiwan related Application, serial No. 104131083 ," dated Oct. 5, 2018, pp. 1-8.

"Office Action of US Related Application, U.S. Appl. No. 15/959,534", dated Jun. 21, 2018, p. 1-p. 30.

"Office Action of China Related Application, Application No. 201510244596.4", dated Apr. 27, 2018, p. 1-p. 11.

"Office Action of US Related Application, U.S. Appl. No. 15/657,299", dated May 16, 2018, p. 1-p. 37.

"Office Action of China Related Application, Application No. 201410362787.6", dated Apr. 20, 2018, p. 1-p. 9.

"Office Action of US Related Application, U.S. Appl. No. 15/908,779", dated Apr. 4, 2018, p. 1-p. 6.

"Office Action of US Related Application, U.S. Appl. No. 15/073,673", dated Feb. 8, 2018, p. 1-p. 23.

"Office Action of U.S. Appl. No. 15/924,461", dated Feb. 15, 2019, pp. 1-47.

"Office Action of U.S. Appl. No. 15/973,552", dated Nov. 29, 2018, pp. 1-22.

"Office Action of U.S. Appl. No. 15/908,779", dated Oct. 30, 2018, pp. 1-28.

* cited by examiner

LIGHT EMITTING COMPONENT

CROSS-REFERENCE TO RELATED APPLICATION

This is a continuation application of and claims the priority benefit of U.S. application Ser. No. 15/168,218, filed on May 30, 2016, now allowed. The prior U.S. application Ser. No. 15/168,218 is a continuation application of and claims the priority benefit of U.S. application Ser. No. 14/462,581, filed on Aug. 19, 2014, now patented, which claims the priority benefit of Taiwan application serial no. 103120334, filed on Jun. 12, 2014. The entirety of each of the above-mentioned patent applications is hereby incorporated by reference herein and made a part of this specification.

BACKGROUND OF THE INVENTION

1. Field of the Invention

The invention relates to a light emitting component and, more particularly, to a light emitting component having a wavelength converting layer with at least one non-planar surface.

2. Description of the Prior Art

Referring to FIG. 1, FIG. 1 is a schematic view illustrating a light emitting component 1 of the prior art. As shown in FIG. 1, the light emitting component 1 comprises a light emitting diode 10 and a phosphor member 12. The phosphor member 12 is formed on the light emitting diode 10 by a dispensing process or a spraying process, so as to package the light emitting diode 10. In general, the phosphor member 12 contains phosphor powders for converting light emitted by the light emitting diode 10 into a desired light color. As shown in FIG. 1, since the phosphor member 12 covers the light emitting diode 10 directly, a decrease in light intensity may occur in the phosphor powders of the phosphor member 12 due to heat generated by the light emitting diode 10. Furthermore, since a surface 120 of the phosphor member 12 is planar, total reflection may occur easily while the light emitted by the light emitting diode 10 passes through the surface 120. Moreover, the phosphor powders excited by the light of the light emitting diode 10 at the surface 120 are limited, such that the quantity of light output is limited accordingly.

SUMMARY OF THE INVENTION

The invention provides a light emitting component having a wavelength converting layer with at least one non-planar surface, so as to solve the aforesaid problems.

According to an embodiment of the invention, a light emitting component comprises a light emitting unit, a molding compound and a wavelength converting layer. The light emitting unit has a forward light emitting surface. The molding compound covers the light emitting unit. The wavelength converting layer is disposed above the molding compound. The wavelength converting layer has a first surface and a second surface opposite to the first surface, wherein the first surface is located between the forward light emitting surface and the second surface, and at least one of the first and second surfaces is non-planar.

Preferably, the first surface contacts the molding compound and is non-planar.

Preferably, the second surface is non-planar.

Preferably, the light emitting component further comprises a light transmissible member disposed on the wavelength converting layer, wherein the second surface contacts the light transmissible member and is planar.

Preferably, the light emitting component further comprises a light transmissible member disposed between the molding compound and the wavelength converting layer, wherein the first surface contacts the light transmissible member and is planar, and the second surface is non-planar.

Preferably, the wavelength converting layer is capable of deforming when a mechanical force is exerted on the wavelength converting layer.

Preferably, the light emitting component further comprises a reflective layer disposed on a side light emitting surface of the light emitting unit around the forward light emitting surface.

As mentioned in the above, the invention disposed the wavelength converting layer above the molding compound, such that the wavelength converting layer does not contact the light emitting unit, so as to prevent the decrease in light intensity from occurring in the phosphor powders of the wavelength converting layer due to heat generated by the light emitting unit. Furthermore, at least one of the first and second surfaces of the wavelength converting layer is non-planar. When the first surface of the wavelength converting layer, which contacts the molding compound, is non-planar, the contact area between the wavelength converting layer and the molding compound increases, such that the phosphor powders excited by the light of the light emitting unit at the first surface increase, so as to enhance the quantity of light output. When the second surface of the wavelength converting layer, which does not contact the molding compound, is non-planar, the total reflection can be reduced while the light emitted by the light emitting unit passes through the second surface. Still further, the invention may dispose the light transmissible member on the wavelength converting layer or between the molding compound and the wavelength converting layer, wherein the light transmissible member is used for guiding the light emitted by the light emitting unit, so as to enhance the quantity of light output. In addition, the light transmissible member may solidify the light emitting component. Moreover, the invention may dispose the reflective layer on the side light emitting surface of the light emitting unit to reflect the light emitted by the side light emitting surface of the light emitting unit, so as to enhance the quantity of light output.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
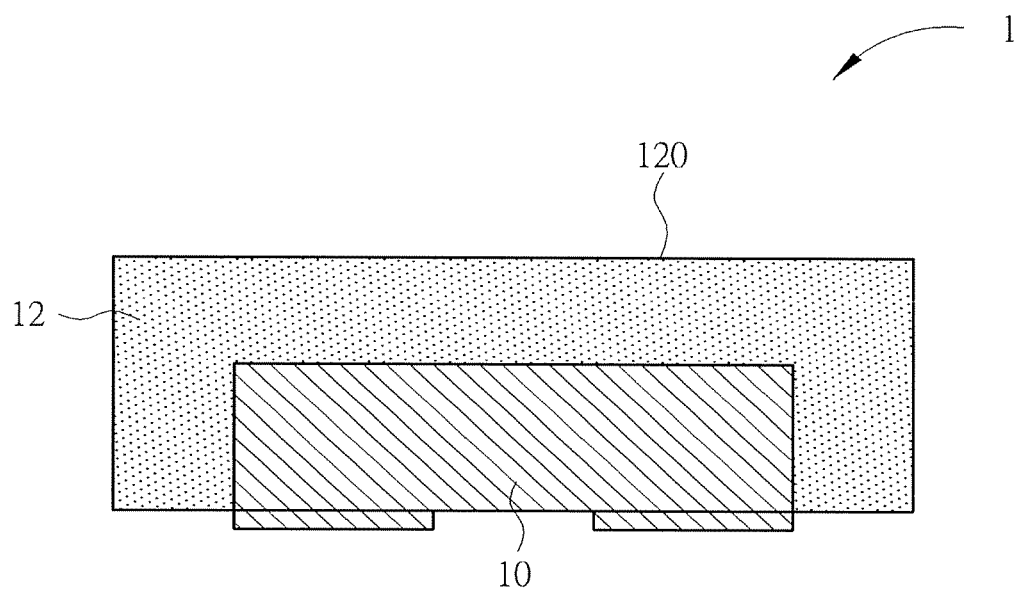
FIG. 1 is a schematic view illustrating a light emitting component of the prior art.
Figure 2:
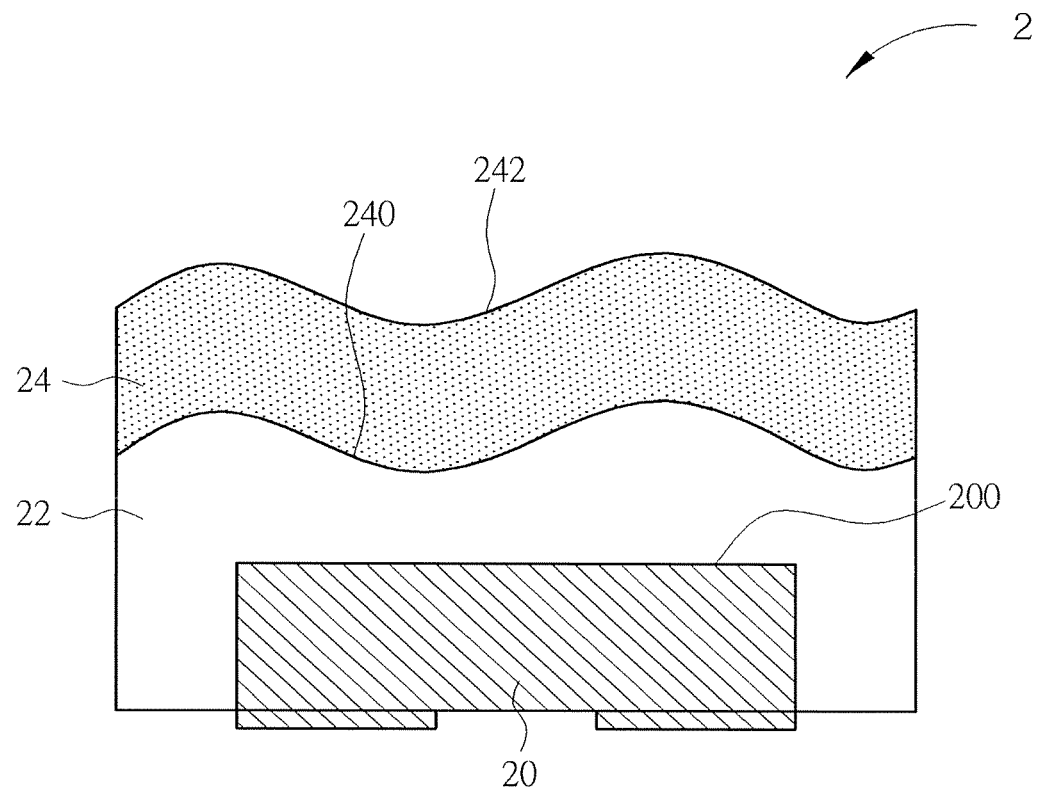
FIG. 2 is a schematic view illustrating a light emitting component according to a first embodiment of the invention.

Referring to FIG. 2, FIG. 2 is a schematic view illustrating a light emitting component 2 according to a first embodiment of the invention. As shown in FIG. 2, the light emitting component 2 comprises a light emitting unit 20, a molding compound 22 and a wavelength converting layer 24. The light emitting unit 20 has a forward light emitting surface 200. The molding compound 22 covers the light emitting unit 20. The wavelength converting layer 24 is disposed above the molding compound 22. The wavelength converting layer 24 has a first surface 240 and a second surface 242 opposite to the first surface 240, wherein the first surface 240 is located between the forward light emitting surface 200 and the second surface 242.

In this embodiment, the light emitting unit 20 may be, but not limited to, a light emitting diode. A material of the molding compound 22 may be silicone, epoxy or other molding compounds. The wavelength converting layer 24 may be made of a mixture of a transparent glue and phosphor powders. The wavelength converting layer 24 may convert a wavelength of the light emitted by the light emitting unit 20 into another wavelength, so as to change the light color of the light emitting unit 20.

As shown in FIG. 2, the first surface 240 of the wavelength converting layer 24 contacts the molding compound 22 and is non-planar. Furthermore, the second surface 242 of the wavelength converting layer 24 is also non-planar. In this embodiment, the first surface 240 and the second surface 242 of the wavelength converting layer 24 may be wave-shaped. However, in another embodiment, the first surface 240 and the second surface 242 of the wavelength converting layer 24 may be saw-toothed, scraggy or other regular/irregular shapes according to practical applications.

In this embodiment, the wavelength converting layer 24 may be made through, but not limited to, the disclosure of Taiwan Patent Application No. 102132241. Specifically, the wavelength converting layer 24 of the invention is capable of deforming when a mechanical force is exerted on the wavelength converting layer 24. In other words, the wavelength converting layer 24 is flexible. Accordingly, a non-planar surface may be formed between the wavelength converting layer 24 and the molding compound 22 through a bonding process or other simple processes without a complicated semiconductor process when the first surface 240 of the wavelength converting layer 24 contacts the molding compound 22.

Figure 3:
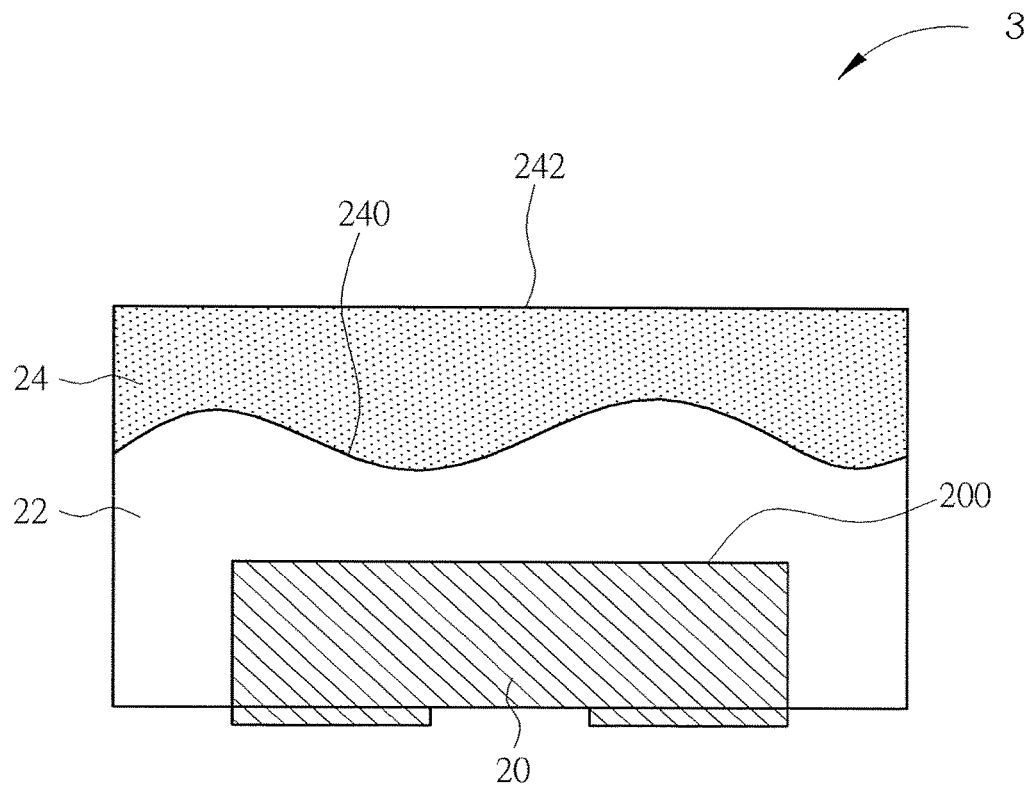
FIG. 3 is a schematic view illustrating a light emitting component according to a second embodiment of the invention.

Referring to FIG. 3 along with FIG. 2, FIG. 3 is a schematic view illustrating a light emitting component 3 according to a second embodiment of the invention. The main difference between the light emitting component 3 and the aforesaid light emitting component 2 is that the second surface 242 of the wavelength converting layer 24 of the light emitting component 3 is planar. It should be noted that the same elements in FIG. 3 and FIG. 2 are represented by the same numerals, so the repeated explanation will not be depicted herein again.

Figure 4:
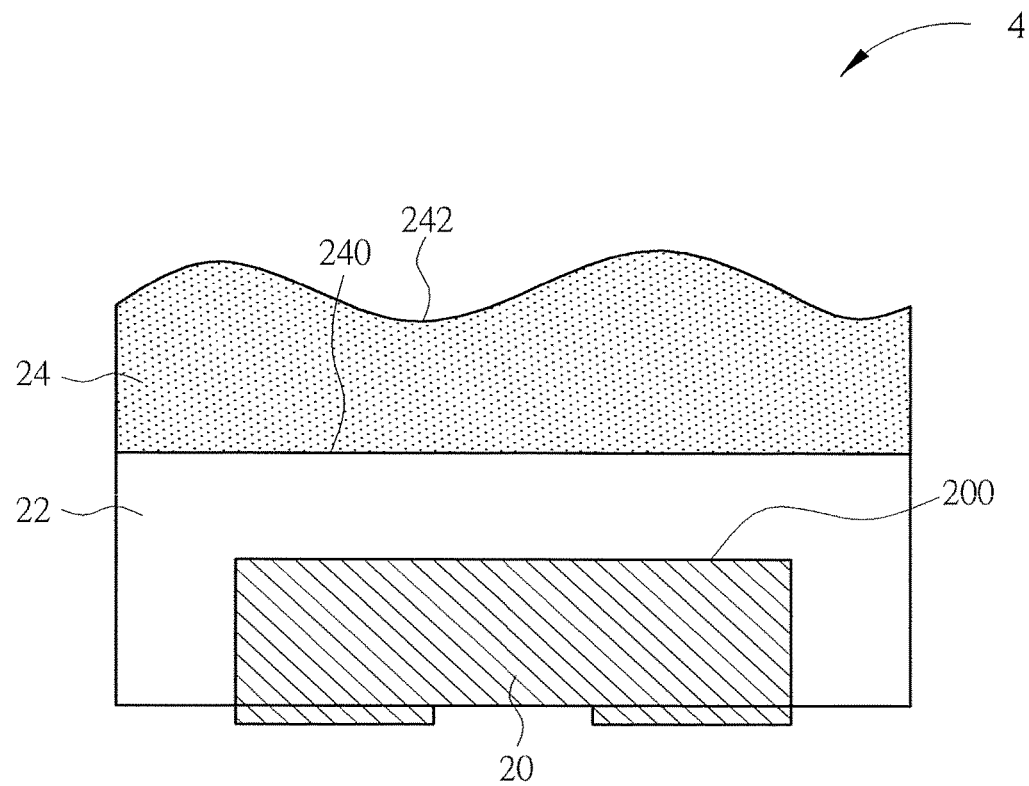
FIG. 4 is a schematic view illustrating a light emitting component according to a third embodiment of the invention.

Referring to FIG. 4 along with FIG. 2, FIG. 4 is a schematic view illustrating a light emitting component 4 according to a third embodiment of the invention. The main difference between the light emitting component 4 and the aforesaid light emitting component 2 is that the first surface 240 of the wavelength converting layer 24 of the light emitting unit 4 is planar. It should be noted that the same elements in FIG. 4 and FIG. 2 are represented by the same numerals, so the repeated explanation will not be depicted herein again.

As the light emitting components 2, 3 and 4 shown in FIGS. 2 to 4, the invention may make at least one of the first surface 240 and the second surface 242 of the wavelength converting layer 24 to be non-planar according to practical applications. When the first surface 240 of the wavelength converting layer 24, which contacts the molding compound 22, is non-planar, the contact area between the wavelength converting layer 24 and the molding compound 22 increases (e.g. the non-planar contact area of the invention may be 1.1 times the planar contact are of the prior art), such that the phosphor powders excited by the light of the light emitting unit 20 at the first surface 240 increase, so as to enhance the quantity of light output. When the second surface 242 of the wavelength converting layer 24, which does not contact the molding compound 22, is non-planar, the total reflection can be reduced while the light emitted by the light emitting unit 20 passes through the second surface 242. Moreover, the invention disposed the wavelength converting layer 24 above the molding compound 22, such that the wavelength converting layer 24 does not contact the light emitting unit 20, so as to prevent the decrease in light intensity from occurring in the phosphor powders of the wavelength converting layer 24 due to heat generated by the light emitting unit 20.

Figure 5:
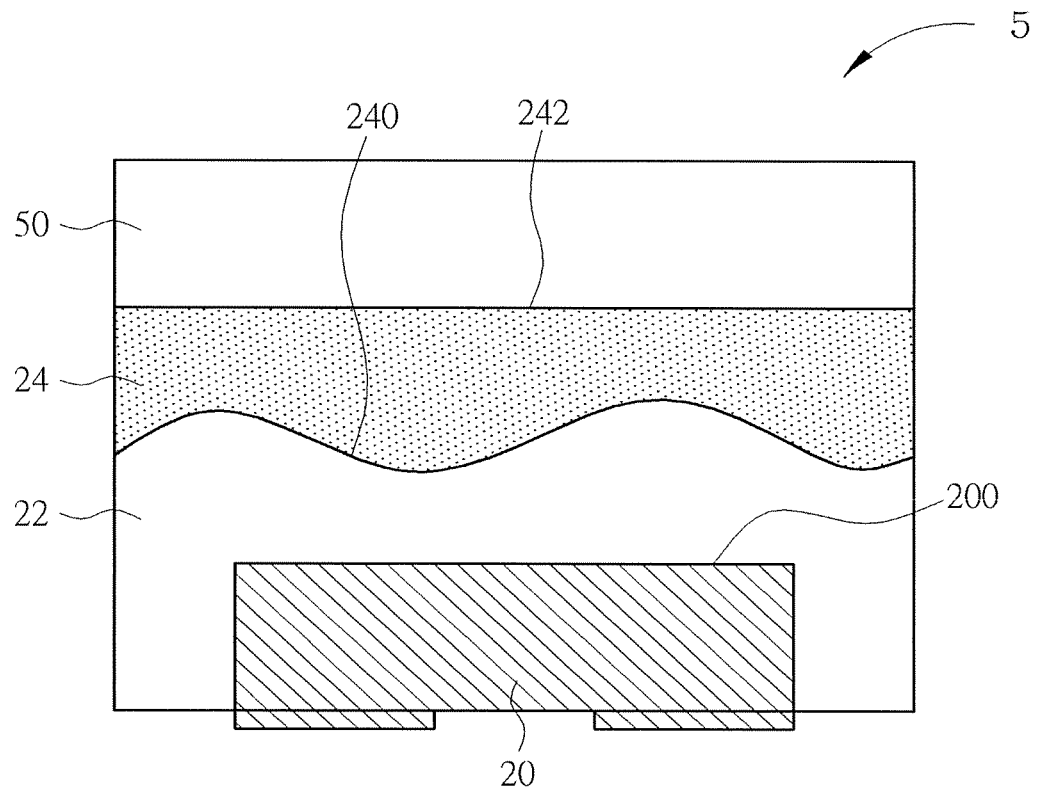
FIG. 5 is a schematic view illustrating a light emitting component according to a fourth embodiment of the invention.

Referring to FIG. 5 along with FIG. 2, FIG. 5 is a schematic view illustrating a light emitting component 5 according to a fourth embodiment of the invention. The main difference between the light emitting component 5 and the aforesaid light emitting component 2 is that the light emitting component 5 further comprises a light transmissible member 50. As shown in FIG. 5, the light transmissible member 50 is disposed on the wavelength converting layer 24, wherein the second surface 242 of the wavelength converting layer 24 contacts the light transmissible member 50 and is planar. In this embodiment, the light transmissible member 50 is used for guiding the light emitted by the light emitting unit 20, so as to enhance the quantity of light output. In addition, the light transmissible member 50 may solidify the light emitting component 5. Furthermore, a material of the light transmissible member 50 may be glass, sapphire or other light transmissible materials. Specifically, since the wavelength converting layer 24 of the invention is capable of deforming when a mechanical force is exerted on the wavelength converting layer 24, the invention may dispose the wavelength converting layer 24 on the light transmissible member 50 first, dispose the light transmissible member 50 on the molding compound 22, and then perform a bonding process or the like to form the non-planar first surface 240. Accordingly, the invention can save manufacture time and cost. It should be noted that the same elements in FIG. 5 and FIG. 2 are represented by the same numerals, so the repeated explanation will not be depicted herein again.

Figure 6:
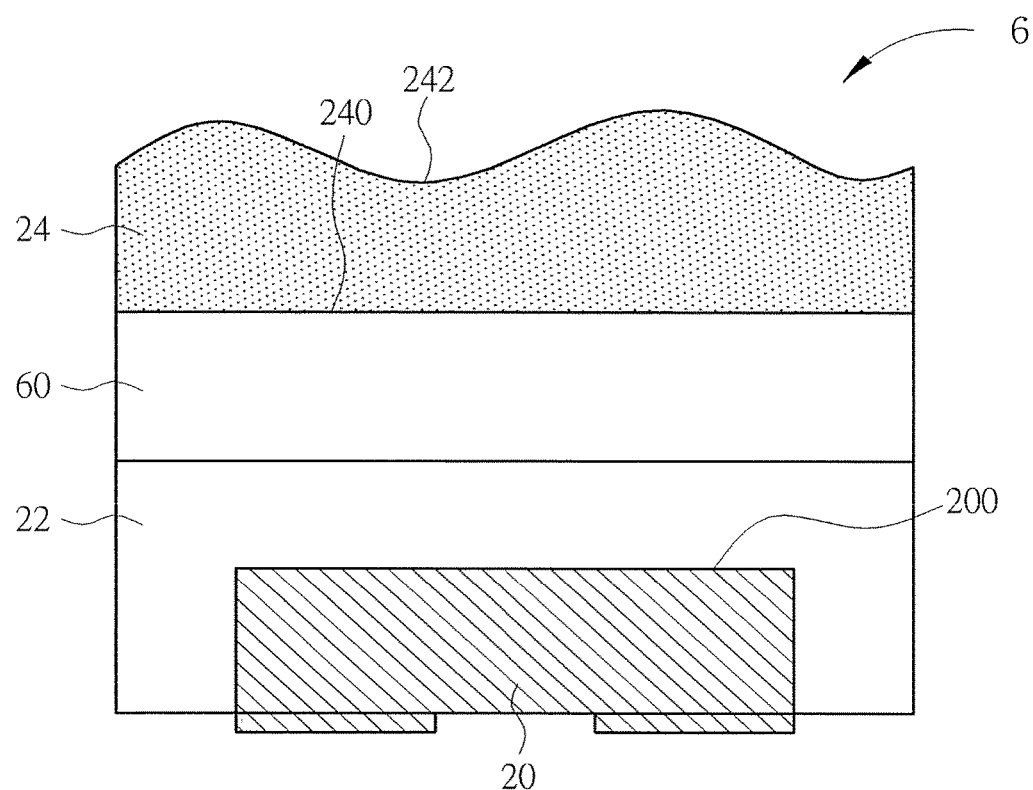
FIG. 6 is a schematic view illustrating a light emitting component according to a fifth embodiment of the invention.

Referring to FIG. 6 along with FIG. 2, FIG. 6 is a schematic view illustrating a light emitting component 6 according to a fifth embodiment of the invention. The main difference between the light emitting component 6 and the aforesaid light emitting component 2 is that the light emitting component 6 further comprises a light transmissible member 60. As shown in FIG. 6, the light transmissible member 60 is disposed between the molding compound 22 and the wavelength converting layer 24, wherein the first surface 240 of the wavelength converting layer 24 contacts the light transmissible member 60 and is planar, and the second surface 242 is non-planar. In this embodiment, the light transmissible member 60 is used for guiding the light emitted by the light emitting unit 20, so as to enhance the quantity of light output. In addition, the light transmissible member 60 may solidify the light emitting component 6. Furthermore, a material of the light transmissible member 60 may be glass, sapphire or other light transmissible materials. It should be noted that the same elements in FIG. 6 and FIG. 2 are represented by the same numerals, so the repeated explanation will not be depicted herein again.

Figure 7:
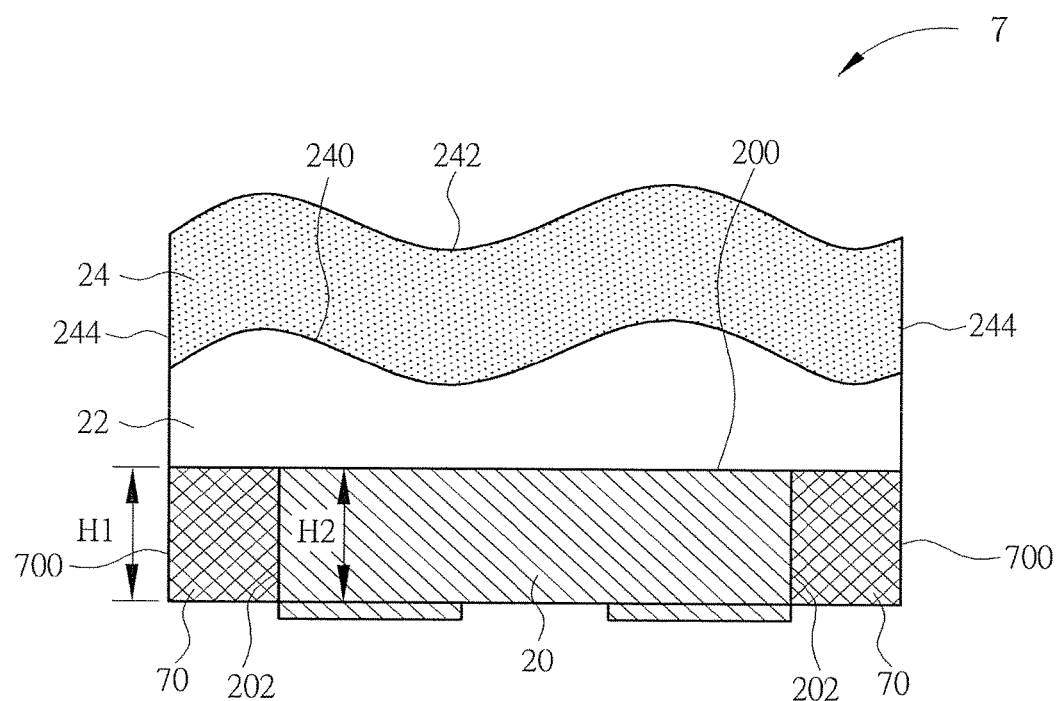
FIG. 7 is a schematic view illustrating a light emitting component according to a sixth embodiment of the invention.

Referring to FIG. 7 along with FIG. 2, FIG. 7 is a schematic view illustrating a light emitting component 7 according to a sixth embodiment of the invention. The main difference between the light emitting component 7 and the aforesaid light emitting component 2 is that the light emitting component 7 further comprises a reflective layer 70. As shown in FIG. 7, the reflective layer 70 is disposed on a side light emitting surface 202 of the light emitting unit 20 around the forward light emitting surface 200. In this embodiment, the reflective layer 70 can reflect the light emitted by the side light emitting surface 202 of the light emitting unit 20, so as to enhance the quantity of light output. Preferably, a vertical height H1 of the reflective layer 70 may be larger than or equal to a vertical height H2 of the side light emitting surface 202 of the light emitting unite 20, so as to reflect the light emitted by the side light emitting surface 202 of the light emitting unit 20 effectively. Furthermore, a side surface 700 of the reflective layer 70 and a side surface 244 of the wavelength converting layer 24 may be coplanar. Still further, a material of the reflective layer 70 may comprise polymer material (e.g. silicone, epoxy, etc.), metal oxide material (e.g. $TiO_2$, $ZrO_2$, $Al_2O_3$, ZnO, etc.), metal material (e.g. Al, Ag, etc.) or a combination thereof. Preferably, the material of the reflective layer 70 may be the combination of the polymer material and the metal oxide material, so as to reduce the cost and simplify the process. It should be noted that the same elements in FIG. 7 and FIG. 2 are represented by the same numerals, so the repeated explanation will not be depicted herein again.

As mentioned in the above, the invention disposed the wavelength converting layer above the molding compound, such that the wavelength converting layer does not contact the light emitting unit, so as to prevent the decrease in light intensity from occurring in the phosphor powders of the wavelength converting layer due to heat generated by the light emitting unit. Furthermore, at least one of the first and second surfaces of the wavelength converting layer is non-planar. When the first surface of the wavelength converting layer, which contacts the molding compound, is non-planar, the contact area between the wavelength converting layer and the molding compound increases, such that the phosphor powders excited by the light of the light emitting unit at the first surface increase, so as to enhance the quantity of light output. When the second surface of the wavelength converting layer, which does not contact the molding compound, is non-planar, the total reflection can be reduced while the light emitted by the light emitting unit passes through the second surface. Still further, the invention may dispose the light transmissible member on the wavelength converting layer or between the molding compound and the wavelength converting layer, wherein the light transmissible member is used for guiding the light emitted by the light emitting unit, so as to enhance the quantity of light output. In addition, the light transmissible member may solidify the light emitting component. Moreover, the invention may dispose the reflective layer on the side light emitting surface of the light emitting unit to reflect the light emitted by the side light emitting surface of the light emitting unit, so as to enhance the quantity of light output.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A light emitting component, comprising:
   a light emitting unit having electrodes disposed a lower surface thereof;
   a reflective layer attached to a side surface of the light emitting unit and at least exposing the electrodes and a top surface of the light emitting unit;
   a wavelength conversion layer disposed over the light emitting unit and the reflective layer; and
   an encapsulation layer, disposed between the light emitting unit and the wavelength conversion layer, covering the top surface of the light emitting unit and at least a portion of the reflective layer,
   wherein the wavelength conversion layer has a non-planar surface and the light emitting component has a flat side surface comprising the reflective layer and the wavelength conversion layer.

2. The light emitting component of claim 1, wherein the electrodes are protruded from a lower surface of the reflective layer.

3. The light emitting component of claim 1, wherein the non-planar surface is located at one side of the wavelength conversion layer opposite to the light emitting unit.

4. The light emitting component of claim 1, wherein the non-planar surface is located at one side of the wavelength conversion layer facing to the light emitting unit.

5. The light emitting component of claim 4, wherein a thickness of the encapsulation layer is not uniform.

6. The light emitting component of claim 4, wherein the electrodes are protruded from a lower surface of the reflective layer.

7. The light emitting component of claim 4, wherein the flat side surface further comprises the encapsulation layer.

8. The light emitting component of claim 3, wherein a thickness of the encapsulation layer is not uniform.

9. The light emitting component of claim 3, wherein the electrodes are protruded from a lower surface of the reflective layer.

10. The light emitting component of claim 3, wherein the flat side surface further comprises the encapsulation layer.

11. The light emitting component of claim 3, wherein an interface between the wavelength conversion layer and the encapsulation layer is non-planar.

12. The light emitting component of claim 2, wherein a thickness of the encapsulation layer is not uniform.

13. The light emitting component of claim 2, wherein the flat side surface further comprises the encapsulation layer.

14. The light emitting component of claim 1, wherein a thickness of the encapsulation layer is not uniform.

15. The light emitting component of claim 1, wherein the flat side surface further comprises the encapsulation layer.

* * * * *